(12) United States Patent
Huang et al.

(10) Patent No.: US 7,528,358 B2
(45) Date of Patent: May 5, 2009

(54) OPTOELECTRONIC SYSTEM FOR SENSING AN ELECTROMAGNETIC FIELD AT TOTAL SOLID ANGLE BY HAVING AT LEAST ONE OPTICAL MODULATOR TO CHANGE THE INTENSITY OF AN OPTICAL WAVE

(75) Inventors: Ming Chieh Huang, Taipei County (TW); Jui Jung Jao, Hsinchu (TW); Wen Lie Liang, Hsinchu (TW); Wen Chung Hsueh, Hsinchu (TW); J. Ch. Bolomey, Gif-sur-Yvette Cedex (FR)

(73) Assignee: Industrial Technology Research Institute, Hsinchu County (TW)

( * ) Notice: Subject to any disclaimer, the term of this patent is extended or adjusted under 35 U.S.C. 154(b) by 103 days.

(21) Appl. No.: 11/615,924

(22) Filed: Dec. 22, 2006

(65) Prior Publication Data

US 2007/0153254 A1   Jul. 5, 2007

(30) Foreign Application Priority Data

Dec. 30, 2005   (TW)   .............................. 94147477 A

(51) Int. Cl.
*H01L 31/00* (2006.01)
*G01J 1/04* (2006.01)

(52) U.S. Cl. ............................... 250/214.1; 250/227.11

(58) Field of Classification Search ............. 250/214.1, 250/206, 206.1, 216, 227.11; 343/703, 759–763
See application file for complete search history.

(56) References Cited

U.S. PATENT DOCUMENTS

| 4,698,983 A | 10/1987 | Hechavarria |
| 6,329,953 B1 | 12/2001 | McKivergan |
| 7,167,133 B2 * | 1/2007 | Nagashima .................. 343/703 |

* cited by examiner

*Primary Examiner*—Que T Le
*Assistant Examiner*—Pascal M Bui-Pho
(74) *Attorney, Agent, or Firm*—WPAT, P.C.; Anthony S. King

(57) ABSTRACT

The optoelectronic system includes a first rotating shaft, at least one cantilever disposed on the first rotating shaft, a rotating stand for loading an emission source under test and at least one optoelectronic module for sensing an electromagnetic field disposed on a free end of the cantilever for sensing an electromagnetic signal emitted from the emission source under test. The rotating stand has a second rotating shaft perpendicular to the first rotating shaft. Preferably, the optoelectronic system includes two optoelectronic sensing modules positioned in an orthogonal manner. Further, the optoelectronic system includes two cantilevers spaced 180° apart and two optoelectronic sensing modules positioned on two free ends of the two cantilevers in an orthogonal manner.

16 Claims, 9 Drawing Sheets

OPTOELECTRONIC SYSTEM FOR SENSING AN ELECTROMAGNETIC FIELD AT TOTAL SOLID ANGLE BY HAVING AT LEAST ONE OPTICAL MODULATOR TO CHANGE THE INTENSITY OF AN OPTICAL WAVE

BACKGROUND OF THE INVENTION (A) Field of the Invention

The present invention relates to an optoelectronic system for sensing an electromagnetic field at total solid angle, and more particularly, to an optoelectronic system for sensing an electromagnetic field at total solid angle that integrates a low-interference optoelectronic module for sensing an electromagnetic field and a spherical space rotating facility.

(B) Description of the Related Art

Due to the rapid development of wireless communication, various wireless communication products such as mobile phones, bluetooth and wireless networks increasingly become more advanced, which brings revolutionary convenience to human beings and drives one of the fastest growing industries in recent years. During the design of various wireless communication products, antenna emission efficiency is a very important topic, and the antenna emission efficiency must be obtained through a total radiated power (TRP) optoelectronic system. Further, according to the latest handset test specification released by Cellular Telecommunications & Internet Association (CTIA) in 2005, two properties of a handset, TRP and total isotropic sensitivity (TIS), must be sensed. Therefore, it is important to develop a low-interference TRP sensing device.

U.S. Pat. No. 4,698,983 discloses a sensing device constructed with an appropriate rotating mechanism device and non-metal materials, which can sense the TRP at the total solid angle. Further, U.S. Pat. No. 6,329,953 discloses a sensing device, wherein the antenna under test is placed on a rotating platform and a plurality of receiving antennae arranged in an annular array is used to receive the electromagnetic field energy emitted by the rotating antenna under test from different angles. However, the receiving antenna mentioned in the above document is a common conventional antenna usually made of metal, which may easily cause distortion in sensing and reduce sensing accuracy.

SUMMARY OF THE INVENTION

One aspect of the present invention provides an optoelectronic system for sensing an electromagnetic field at total solid angle, which integrates a low-interference optoelectronic module for sensing an electromagnetic field and a spherical space rotating facility.

An optoelectronic system for sensing an electromagnetic field at total solid angle according to this aspect comprises a first rotating shaft, at least one cantilever disposed on the first rotating shaft, a rotating stand configured to load an emission source under test and at least one optoelectronic module disposed at one end of the cantilever, wherein the optoelectronic module is configured to sense an electromagnetic signal generated by the emission source under test.

The prior art uses metallic wires to transmit signals, which may easily cause signal distortion in sensing and reduce sensing accuracy. The optoelectronic module of the optoelectronic system for sensing an electromagnetic field at total solid angle according to the present invention uses a non-metal optical fiber to transmit a signal under test, which does not cause distortion of the signal under test and can precisely sense the distributed power of the electromagnetic field.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
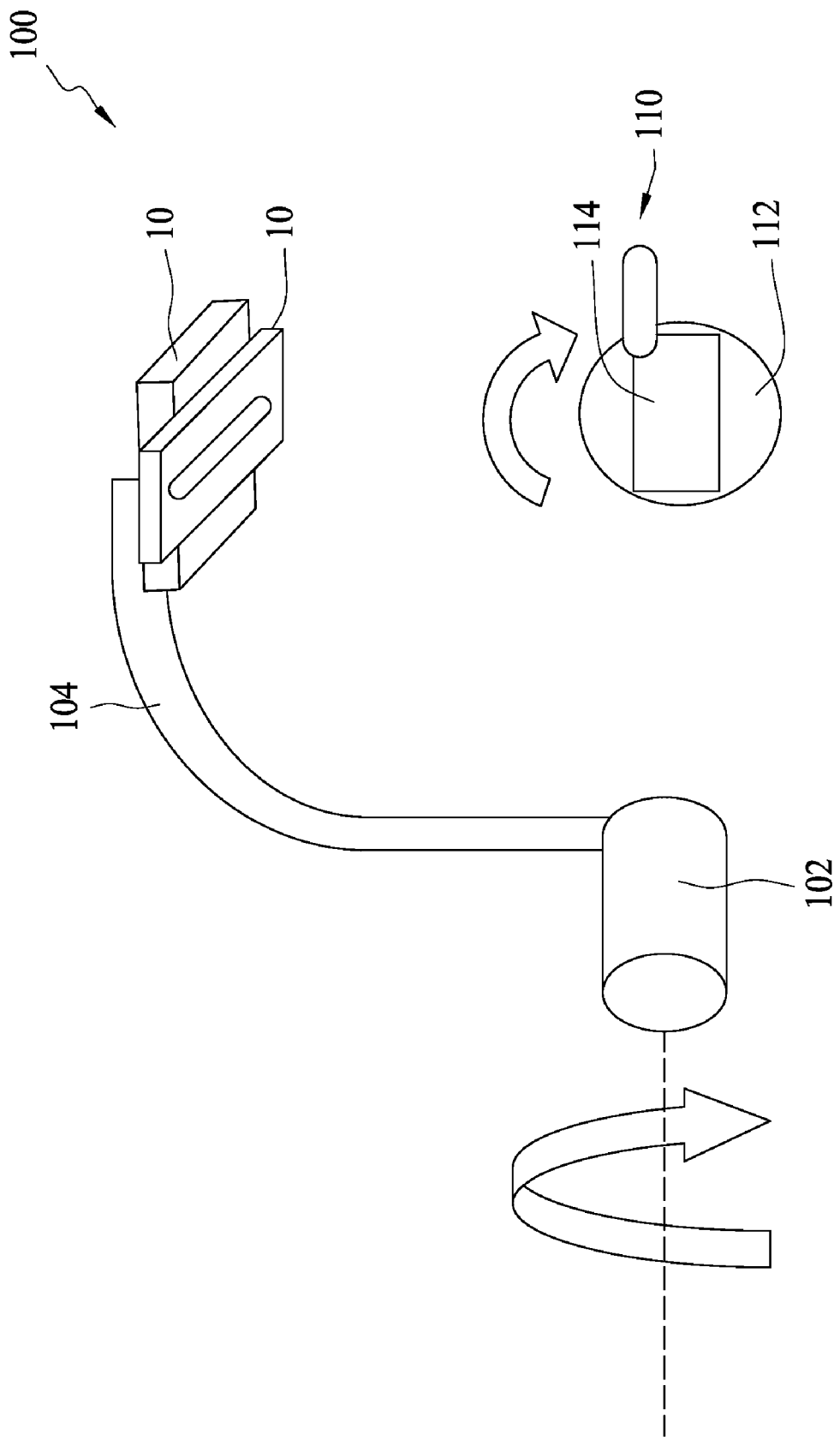
FIGS. 1 and 2 illustrate an optoelectronic system for sensing an electromagnetic field at total solid angle according to a first embodiment of the present invention.
Figure 2:
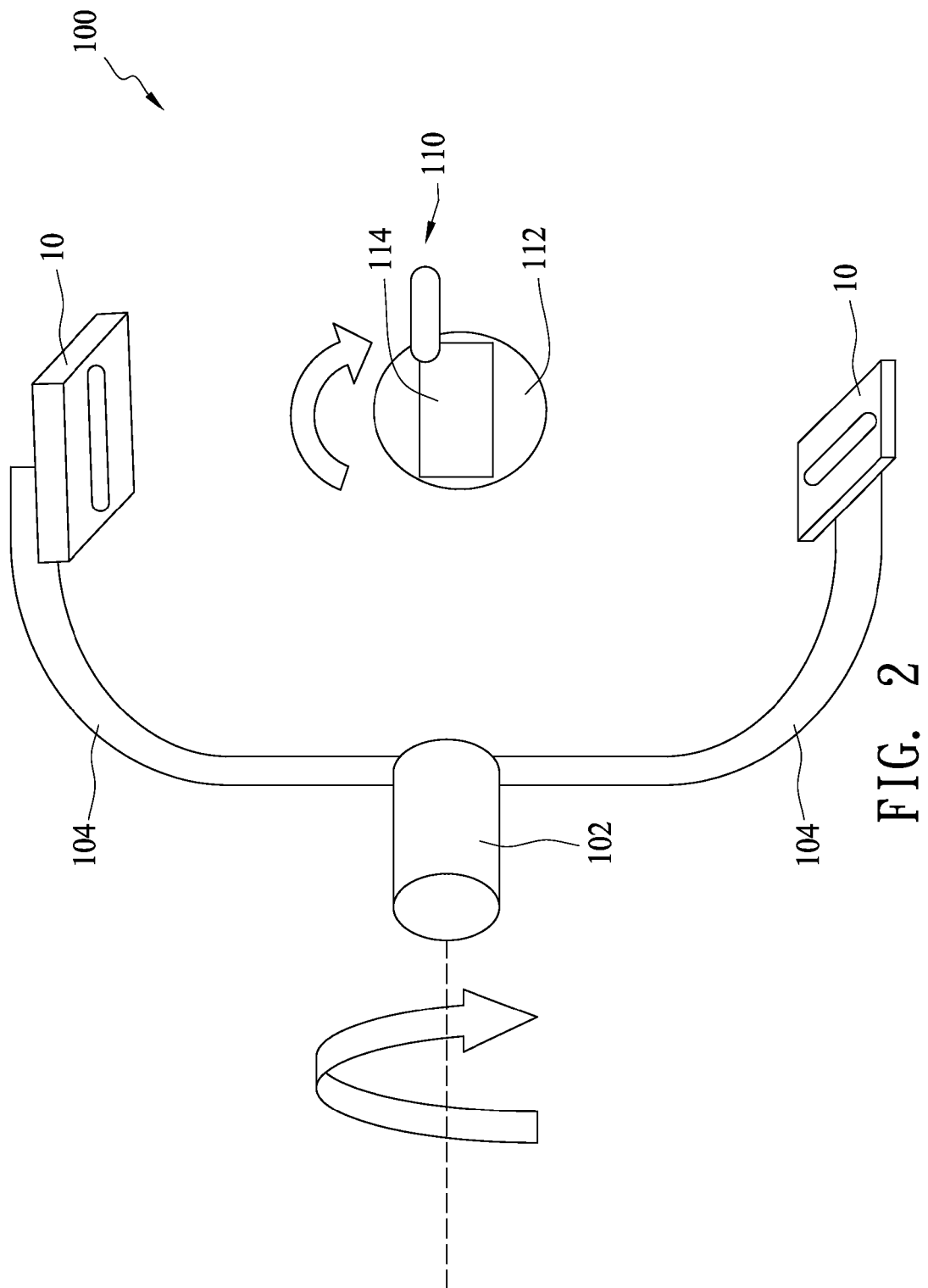

FIG. 1 illustrates an optoelectronic system 100 for sensing an electromagnetic field at total solid angle according to a first embodiment of the present invention. The optoelectronic system 100 includes a first rotating shaft 102, at least one cantilever 104 disposed on the first rotating shaft 102, a rotating stand 110 configured to load an emission source 114 under test and at least one optoelectronic module 10 disposed on a free end of the cantilever 104 and configured to sense an electromagnetic signal emitted from the emission source 114 (for example, a handset) under test. The rotating stand 110 has a second rotating shaft 112 perpendicular to the first rotating shaft 102. Preferably, the optoelectronic system 100 includes two optoelectronic sensing modules 10 positioned in an orthogonal manner. Further, the optoelectronic system 100 includes two cantilevers 104 spaced 180° apart and two optoelectronic modules 10 positioned on the two free ends of the two cantilevers in an orthogonal manner, as shown in FIG. 2.

Figure 3:
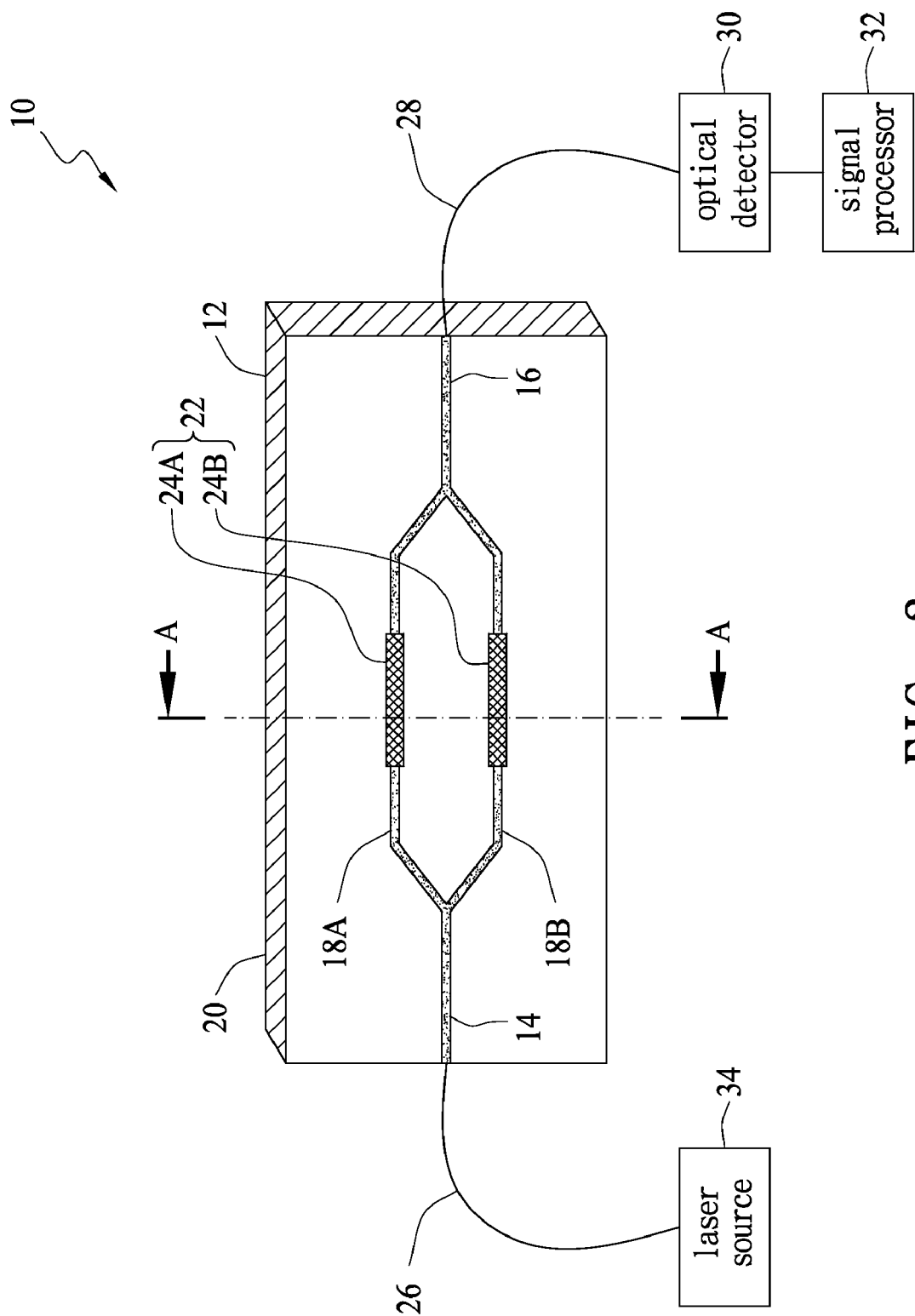
FIGS. 3 and 4 illustrate an optoelectronic module for sensing an electromagnetic field according to the first embodiment of the present invention.
Figure 4:
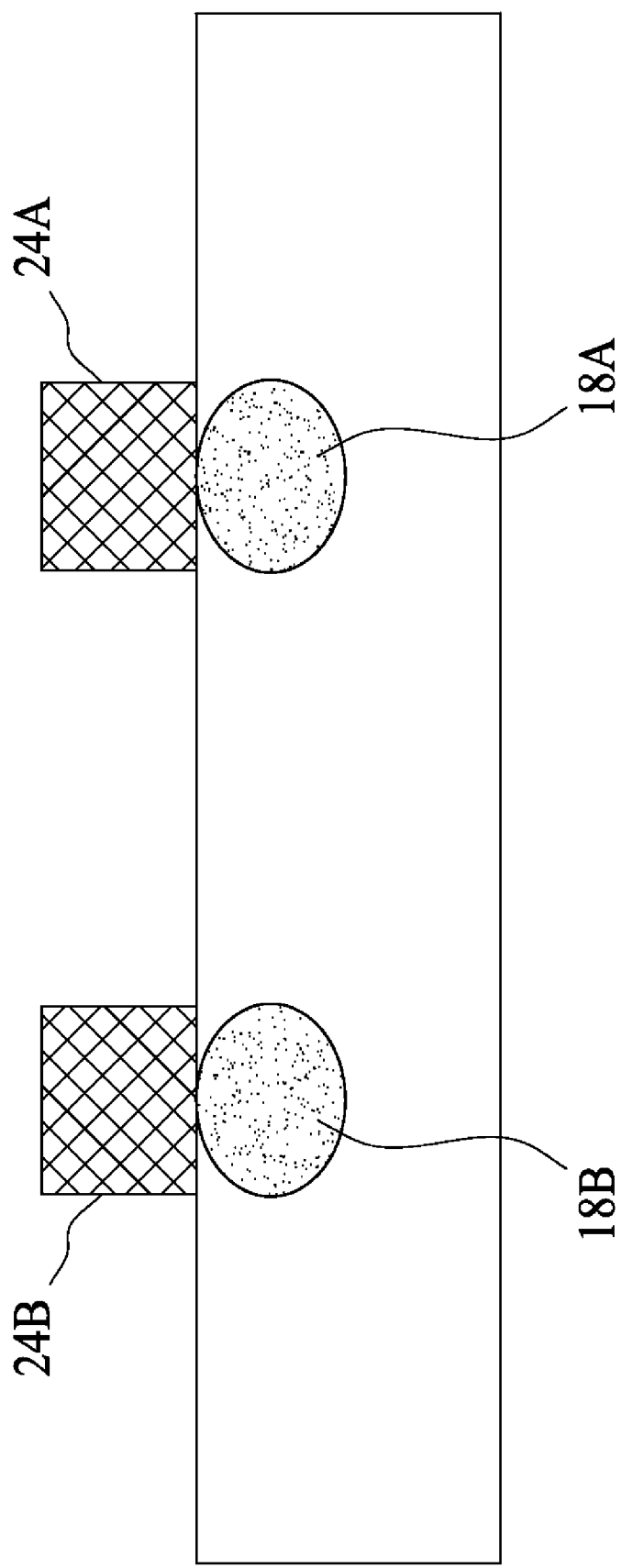

FIGS. 3 and 4 illustrate an optoelectronic module 10 according to a first embodiment of the present invention. The optoelectronic module 10 includes an optical modulator 20 configured to change the intensity of an optical wave propagating therethrough based on an applied electric field, an optical detector 30 coupled to the optical modulator 20, a first optical fiber 26 connecting a laser source 34 and the optical modulator 20 and a second optical fiber 28 connecting the optical modulator 20 and the optical detector 30. Further, the optical modulator 20 includes a substrate 12 made of lithium niobate crystal, an optical input waveguide 14 disposed in the substrate 12 and coupled to the first optical fiber 26, an optical output waveguide 16 disposed in the substrate 12 and coupled to the second optical fiber 28, two optical modulation waveguides 18A, 18B disposed in the substrate 12 and an antenna 22 disposed on the surface of the substrate 12. The antenna 22 consists of two metallic conductive segments 24A, 24B disposed on the surface of the substrate 12 above the optical modulation waveguides 18A, 18B, respectively. One end of the optical modulation waveguides 18A, 18B is coupled to the optical input waveguide 14, and the other end is coupled to the optical output waveguide 16. In particular, the laser beam emitted from the laser source 20 is coupled to the optical input waveguide 14 via the optical fiber 26, splits to enter the optical modulation waveguides 18A, 18B, and integrates into the optical output waveguide 16.

FIG. 4 is a cross-sectional view of the optical modulator 20 in FIG. 3 along a cross-sectional line A-A. The antenna 22 senses the electric field of the emission source 114 under test and applies a corresponding electric field to the optical modulation waveguides 18A, 18B. The transmission speed of the laser beam in a medium decreases with the increase of the refractive index of the medium. When a potential difference exists (i.e., an electric field is generated) between the metallic conductive segments 24A, 24B, the refractive index of the optical modulation waveguides 18A, 18B changes such that the phase of the laser beam propagating through the optical modulation waveguides 18A, 18B changes. Therefore, an interference light is formed when the laser beam enters the optical output waveguide 16 from the optical modulation waveguides 18A, 18B, and the phase and intensity of the interference light change with the potential difference between the metallic conductive segments 24A, 24B. In particular, the electric field sensed by the antenna 22 is converted into an optical signal by the optical modulator 20, and then the optical signal is transmitted to the optical detector 30 through the optical fiber 28 instead of a cable. Therefore, the interference problem caused by using a cable for transmitting signals in the conventional art can be solved.

Figure 5:
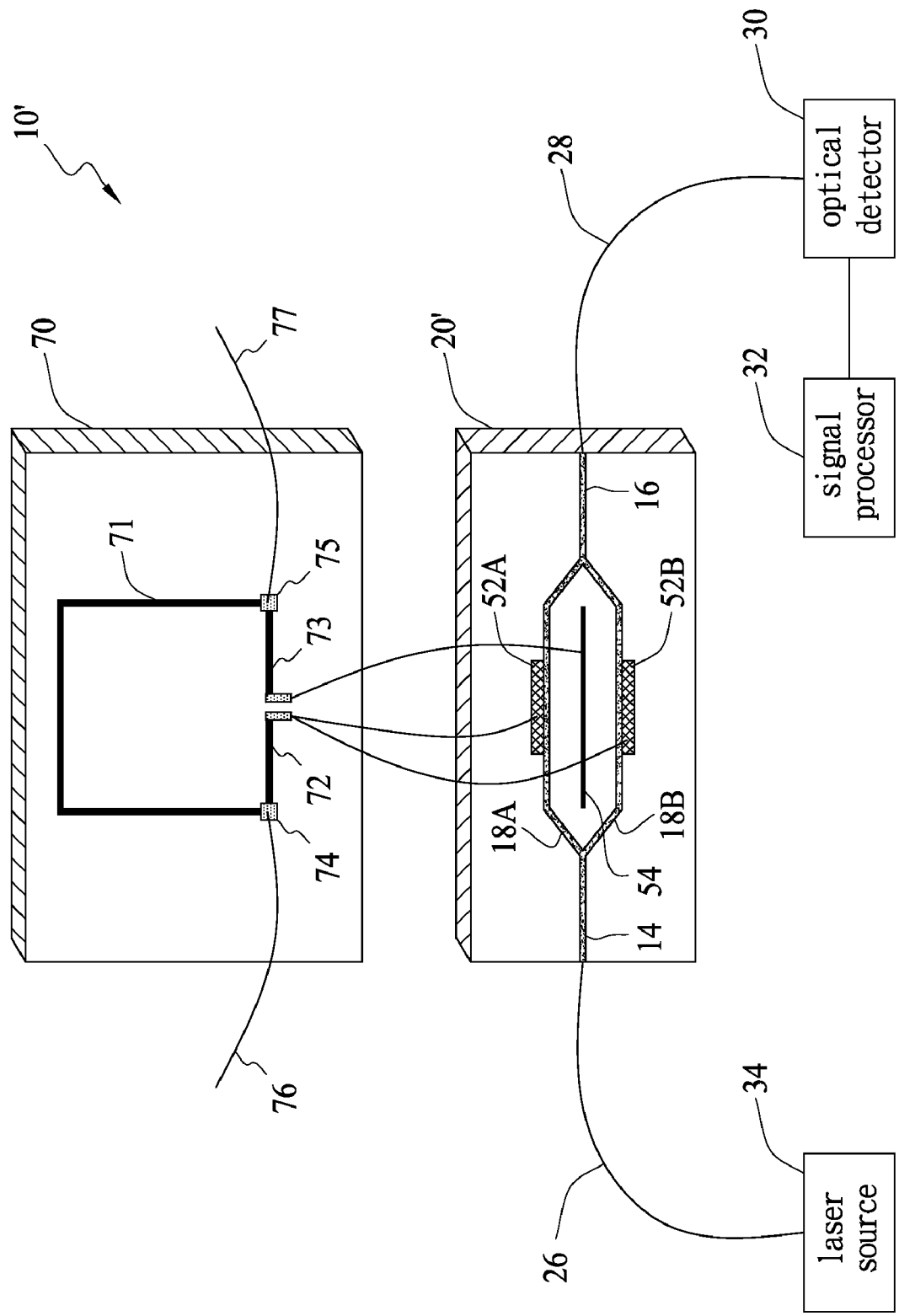
FIG. 5 illustrates an optoelectronic module for sensing an electromagnetic field according to a second embodiment of the present invention.

FIG. 5 illustrates an optoelectronic module for sensing an electromagnetic field 10' according to a second embodiment of the present invention. The optoelectronic module 10' includes an optical modulator 20' and an external antenna 70. Compared with the optoelectronic module 10 in FIG. 3 which uses a built-in antenna 22, the optoelectronic module 10' in FIG. 5 employs an external dipole antenna (i.e., an external antenna 70). In addition to disposing electrodes 52A, 52B on the outer sides of the optical modulation waveguides 18A, 18B respectively and disposing an electrode 54 between the electrodes 52A, 52B, the structure of the optical modulator 20' is substantially similar to the optoelectronic module 10 in FIG. 3, wherein the phase of a laser beam propagating therethrough can be changed based on an applied electric field.

The external antenna 70 senses the electric field and magnetic field of the emission source 112 under test, and applies a potential difference to the electrodes 52A, 52B, 54 of the optical modulator 20'. The external antenna 70 includes a first conductive segment 71, a first optical switch 74 disposed at one end of the first conductive segment 71, a second optical switch 75 disposed at the other end of the first conductive segment 71, a second conductive segment 72 connected to the first conductive segment 71 via the first optical switch 74 and a third conductive segment 73 connected to the first conductive segment 71 via the second optical switch 75. When the external antenna 70 senses an electromagnetic signal emitted from the emission source 114 under test, a potential difference corresponding to the electromagnetic signal is applied between the electrodes 52A, 52B and the electrode 54.

Figure 6:
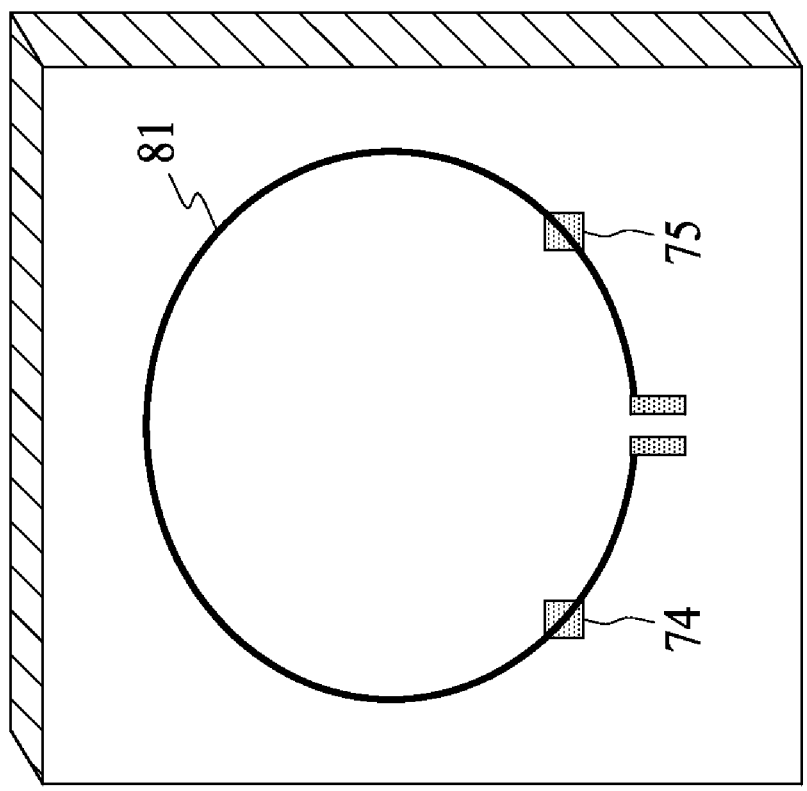
FIG. 6 illustrates an external antenna according to another embodiment of the present invention.

When the first optical switch 74 and the second optical switch 75 are conducted, the first conductive segment 71, the second conductive segment 72 and the third conductive segment 74 form an annular antenna for sensing a magnetic field signal. The second conductive segment 72 and the third conductive segment 74 form a dipole antenna for sensing an electric field signal when the first optical switch 74 and the second optical switch 75 are not conducted. The optical fibers 76, 77 are used to transmit switch signals for the first optical switch 74 and the second optical switch 75. Moreover, in addition to the rectangular shape in FIG. 5, the annular antenna can be circular, i.e. the circular antenna 81 of the external antenna 70' in FIG. 6.

Figure 7:
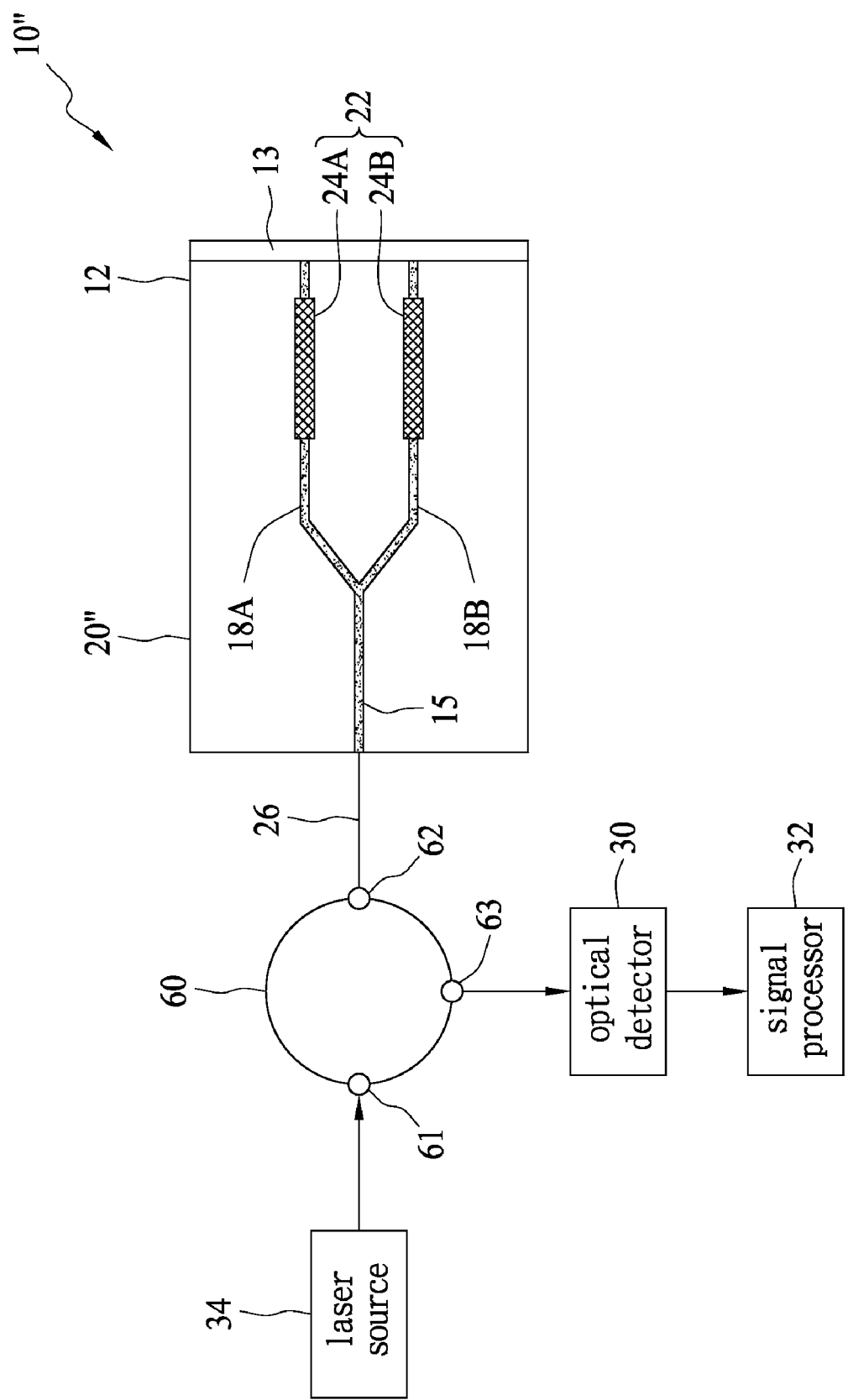
FIG. 7 illustrates an optoelectronic module for sensing an electromagnetic field according to another embodiment of the present invention.

FIG. 7 illustrates an optoelectronic module 10" for sensing an electromagnetic field according to a third embodiment of the present invention. Compared with the optoelectronic module 10 in FIG. 3, the optoelectronic module 10" in FIG. 7 includes an optical circulator 60 and an optical modulator 20". In particular, the optical circulator 60 includes a first port 61, a second port 62, and a third port 63. The laser beam emitted from the laser source 34 is input into the optical circulator 60 via the first port 61 and output from the second port 62. The optical modulator 20" is connected to the second port 62, and the optical detector 30 is connected to the third port 63. The optical modulator 20" includes a substrate 12, a mirror 13 disposed on a side surface of the substrate 12, an optical input/output waveguide 15 disposed in the substrate 12, two optical modulation waveguides 18A, 18B disposed in the substrate 12 and an antenna 22 disposed on the surface of the substrate 12. One end of the optical modulation waveguides 18A, 18B is coupled to the optical input/output waveguide 15, and the other end is terminated at the mirror 13. The laser beam is input into the optical circulator 60 via the first port 61, and output from the second port 62 and coupled to the optical input/output waveguide 15. Next, the laser beam is split to enter the optical modulation waveguides 18A, 18B, reflected by the mirror 13, and then transmitted to the second port 62 of the optical circulator 60 along the original path. Afterwards, the laser beam is output from the third port 63 and the optical detector 30 detects the intensity of the laser beam from the third port 63.

Figure 8:
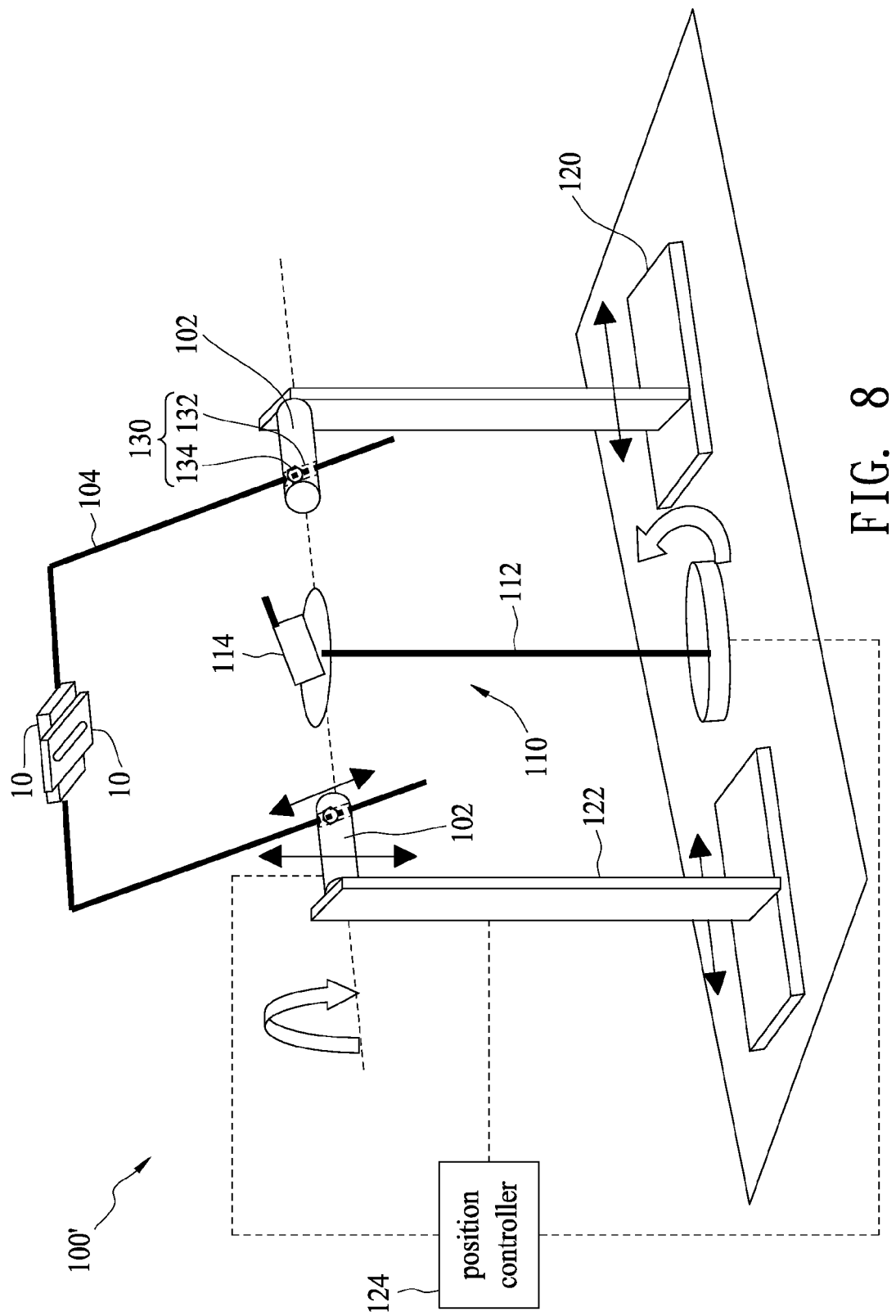
FIG. 8 illustrates an optoelectronic system for sensing an electromagnetic field at total solid angle according to another embodiment of the present invention.

FIG. 8 illustrates an optoelectronic system 100' for sensing an electromagnetic field at total solid angle according to a second embodiment of the present invention. Compared with the optoelectronic system 100 in FIG. 1, the optoelectronic system 100' in FIG. 8 further includes a horizontal slide rail 120 and a vertical slide rail 122 disposed on the horizontal slide rail 120, wherein the first rotating shaft 102 is disposed on the vertical slide rail 122. Preferably, the cantilever 104 is disposed on the first rotating shaft 102 via a moving mechanism 130 (constituted by an opening 132 disposed in the first rotating shaft 102 and a fixing bolt 134). Moreover, the optoelectronic system 100' further includes a position controller 124 for controlling the relative position between the rotating stand 110 and the optoelectronic module 10.

Figure 9:
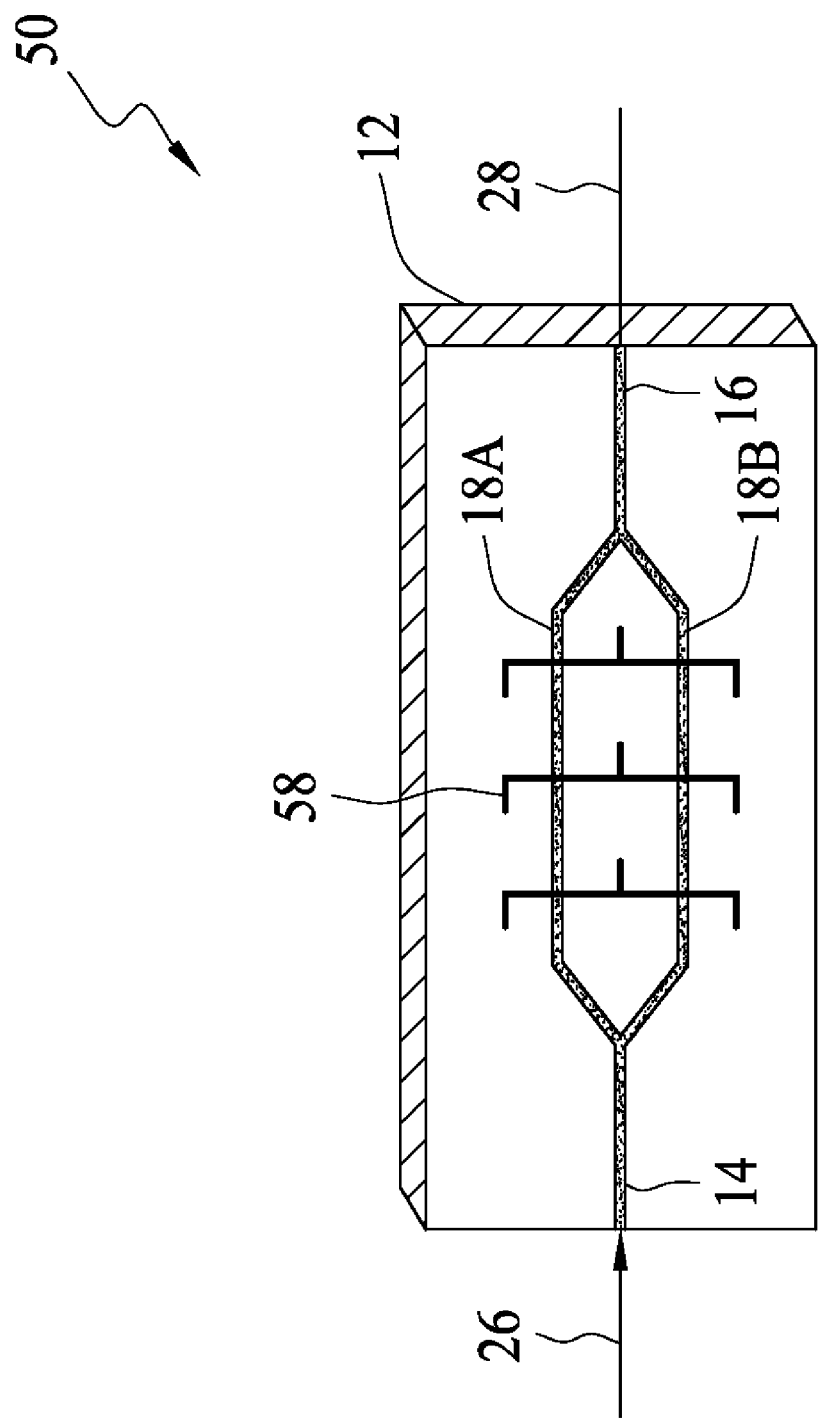
FIG. 9 illustrates an optical modulator according to another embodiment of the present invention.

FIG. 9 illustrates the optical modulator 50 according to a second embodiment of the present invention. Compared with the optical modulator 20' in FIG. 5 which uses the external antenna 70 to sense the electric field and magnetic field intensities of the emission source 112 under test, the optical modulator 50 in FIG. 9 has an electrode pattern 58 disposed on the surface of the substrate 12 for sensing the electric field and magnetic field of the emission source 112 under test without an external antenna. Further, the optical modulator 20" in FIG. 7 can also substitute the electrode pattern 58 in FIG. 9 for the metal conductive segments 24A, 24B on the optical modulation waveguides 18A, 18B.

The prior art uses metallic wires to transmit signals, which may easily cause signal distortion in sensing and reduce the sensing accuracy. The optoelectronic module of the optoelectronic system for sensing an electromagnetic field at total solid angle according to the present invention uses non-metal optical fibers to transmit a signal under test, which does not cause distortion of the signal under test, and can precisely sense the distributed power of the electromagnetic field. The scanning of the total solid angle is completed by rotating the first rotating shaft 102 and the cantilever 104 by 360° so as to obtain the precise electromagnetic field energy radiated by the object under test.

The above-described embodiments of the present invention are intended to be illustrative only. Numerous alternative embodiments may be devised by those skilled in the art without departing from the scope of the following claims.

What is claimed is:

1. An optoelectronic system for sensing an electromagnetic field at total solid angle, comprising:
    a first rotating shaft;
    at least one cantilever disposed on the first rotating shaft;
    a rotating stand configured to load an emission source under test; and
    at least one optoelectronic module disposed at one end of the cantilever, the optoelectronic module being configured to sense an electromagnetic signal generated by the emission source under test;
    at least one optical modulator configured to change the intensity of an optical wave propagating therethrough based on an applied electric field;
    an optical detector coupled to the optical modulator;
    a first optical fiber connecting a laser source and the optical modulator; and
    a second optical fiber connecting the optical modulator and the optical detector.

2. The optoelectronic system for sensing an electromagnetic field at total solid angle as claimed in claim 1, wherein the rotating stand has a second rotating shaft perpendicular to the first rotating shaft.

3. The optoelectronic system for sensing an electromagnetic field at total solid angle as claimed in claim 1, further comprising:
    a horizontal slide rail; and
    a vertical slide rail disposed on the horizontal slide rail, wherein the first rotating shaft is disposed on the vertical slide rail.

4. The optoelectronic system for sensing an electromagnetic field at total solid angle as claimed in claim 1, wherein the optoelectronic module is disposed on a free end of the cantilever.

5. The optoelectronic system for sensing an electromagnetic field at total solid angle as claimed in claim 1, further comprising a moving mechanism disposed on the first rotating shaft, and the cantilever being disposed on the first rotating shaft via the moving mechanism.

6. The optoelectronic system for sensing an electromagnetic field at total solid angle as claimed in claim 1, further comprising a position controller configured to control the relative position between the rotating stand and the optoelectronic module.

7. The optoelectronic system for sensing an electromagnetic field at total solid angle as claimed in claim 1, further comprising two optoelectronic modules positioned in an orthogonal manner.

8. The optoelectronic system for sensing an electromagnetic field at total solid angle as claimed in claim 1, wherein the at least one cantilever is comprised of two cantilevers spaced 180° apart, and wherein the at least one optoelectronic module is comprised of two optoelectronic modules positioned on the two free ends of the two cantilevers in an orthogonal manner.

9. The optoelectronic system for sensing an electromagnetic field at total solid angle as claimed in claim 1, wherein the optical modulator comprises:
    a substrate;
    an optical input waveguide disposed inside the substrate and coupled to the first optical fiber;
    an optical output waveguide disposed inside the substrate and coupled to the second optical fiber;
    two optical modulation waveguides disposed in the substrate, and the optical modulation waveguides having a first end coupled to the optical input waveguide and a second end coupled to the optical output waveguide; and
    an electrode pattern disposed on the surface of the substrate.

10. The optoelectronic system for sensing an electromagnetic field at total solid angle as claimed in claim 1, wherein the optoelectronic module comprises an external antenna.

11. The optoelectronic system for sensing an electromagnetic field at total solid angle as claimed in claim 10, wherein the external antenna comprises:
    a first conductive segment;
    a first optical switch disposed at an end of the first conductive segment;
    a second optical switch disposed at the other end of the first conductive segment;
    a second conductive segment connected to the first conductive segment via the first optical switch; and
    a third conductive segment connected to the first conductive segment via the second optical switch.

12. The optoelectronic system for sensing an electromagnetic field at total solid angle as claimed in claim 11, wherein the second conductive segment and the third conductive segment are disposed in a straight manner.

13. The optoelectronic system for sensing an electromagnetic field at total solid angle as claimed in claim 11, wherein the first conductive segment, the second conductive segment and the third conductive segment are disposed in a ring-shaped manner.

14. The optoelectronic system for sensing an electromagnetic field at total solid angle as claimed in claim 13, wherein the ring shape is rectangular or circular.

15. The optoelectronic system for sensing an electromagnetic field at total solid angle as claimed in claim 10, wherein the external antenna is a dipole antenna consisting essentially of a first conductive segment and a second conductive segment.

16. The optoelectronic system for sensing an electromagnetic field at total solid angle as claimed in claim 10, wherein the external antenna is an annular antenna.

* * * * *